(12) United States Patent
Tjernberg

(10) Patent No.: US 9,366,734 B2
(45) Date of Patent: Jun. 14, 2016

(54) SPIN-FILTER AND DETECTOR COMPRISING THE SAME

(76) Inventor: Oscar Tjernberg, Stockholm (SE)

( * ) Notice: Subject to any disclaimer, the term of this patent is extended or adjusted under 35 U.S.C. 154(b) by 0 days.

(21) Appl. No.: 14/110,202

(22) PCT Filed: Mar. 22, 2012

(86) PCT No.: PCT/SE2012/050318
§ 371 (c)(1),
(2), (4) Date: Oct. 7, 2013

(87) PCT Pub. No.: WO2012/141643
PCT Pub. Date: Oct. 18, 2012

(65) Prior Publication Data
US 2014/0021569 A1    Jan. 23, 2014

(30) Foreign Application Priority Data

Apr. 15, 2011    (SE) ........................... 1150326

(51) Int. Cl.
| | | |
|---|---|---|
| *G01R 33/12* | (2006.01) | |
| *B82Y 10/00* | (2011.01) | |
| *H01F 41/32* | (2006.01) | |

(52) U.S. Cl.
CPC ............. *G01R 33/1284* (2013.01); *B82Y 10/00* (2013.01); *H01F 41/32* (2013.01); *H01F 41/325* (2013.01)

(58) Field of Classification Search
CPC ..................................................... H01L 43/02
USPC ....................................................... 257/421
See application file for complete search history.

(56) References Cited

U.S. PATENT DOCUMENTS

| | | | |
|---|---|---|---|
| 6,583,410 B1 * | 6/2003 | Seddon | ................. 250/305 |
| 2005/0111145 A1 | 5/2005 | Yuasa et al. | |
| 2007/0064351 A1 | 3/2007 | Wang et al. | |
| 2009/0057793 A1 | 3/2009 | Koga | |

FOREIGN PATENT DOCUMENTS

EP    2492984 A2    8/2012

OTHER PUBLICATIONS

International Search Report for corresponding patent application No. PCT/SE2012/050318 dated Sep. 11, 2012.
Oberli, D et al. Total Scattering Cross Section and Spin Motion of Low Energy Electrons. Physical Review Letters. Nov. 1998, vol. 81, No. 19, pp. 4228-4231, ISSN 0031-9007; p. 4228 and 4229.
Dey P and Weber W., Electron-spin motion: a new tool to study ferromagnetic films and surfaces. Journal of Physics, Nov. 2011, vol. 23, No. 47, p. 473201, ISSN 0953-8984.
Rougemaille N et al., Spin-dependent electron transport in ferromagnetic bilayers: Application to three-dimensional spin detectors. Journal of Applied Physics, May 2002, vol. 91, No. 10, pp. 8408-8410, ISSN 0021-8979.

(Continued)

*Primary Examiner* — Lex Malsawma
*Assistant Examiner* — J. R. Oakley
(74) *Attorney, Agent, or Firm* — Renner, Otto, Boisselle & Sklar, LLP

(57) ABSTRACT

A spin-filter for detection of angular momentum of electrons, wherein the spin-filter (1) comprises a substrate (10), provided with at least one membrane layer (12) having a first surface (11) and having a plurality of membranes (12*n*) coated with a magnetic thin-film (14), wherein the membranes (12*n*) comprises pores (13) having a magnetic thin-film (14) for transmission of electrons.

9 Claims, 2 Drawing Sheets

(56) References Cited

OTHER PUBLICATIONS

Drouhin H J et al., Spin filtering in ferromagnetic bilayers, Journal of Applied Physics, Jun. 2002, vol. 91, No. 12, pp. 9948-9951, ISSN 0021-8979.

Himpsel F J et al., Electronic states in magnetic nanostructures, Journal of Magnetism and Magnetic Materials, Oct. 1999, vol. 200, No. 1-3, pp. 456-469, ISSN 0304-8853.

Extended European Search Report for corresponding Patent Application No. 12771520.9 dated Apr. 24, 2015.

* cited by examiner

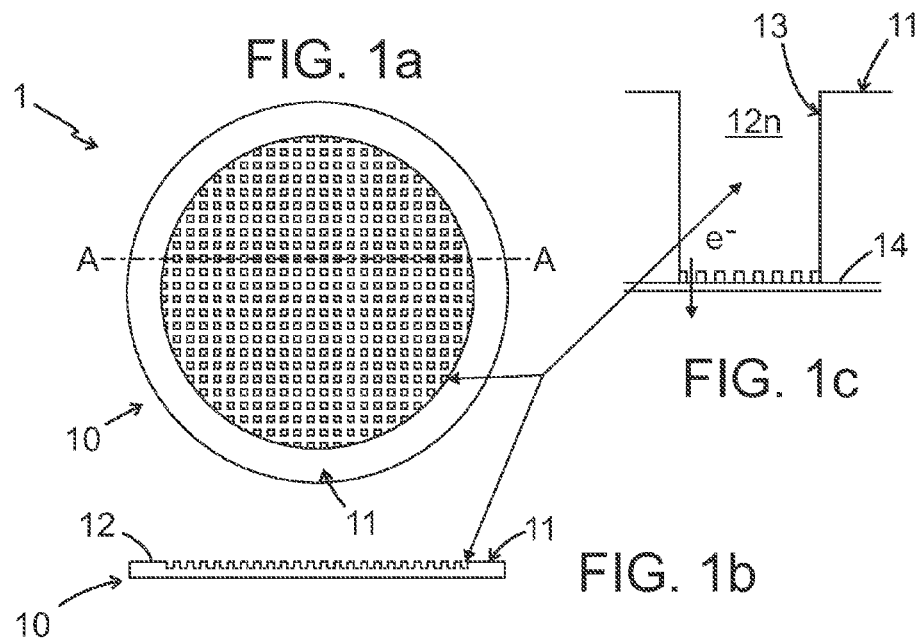
FIG. 1a
FIG. 1c
FIG. 1b
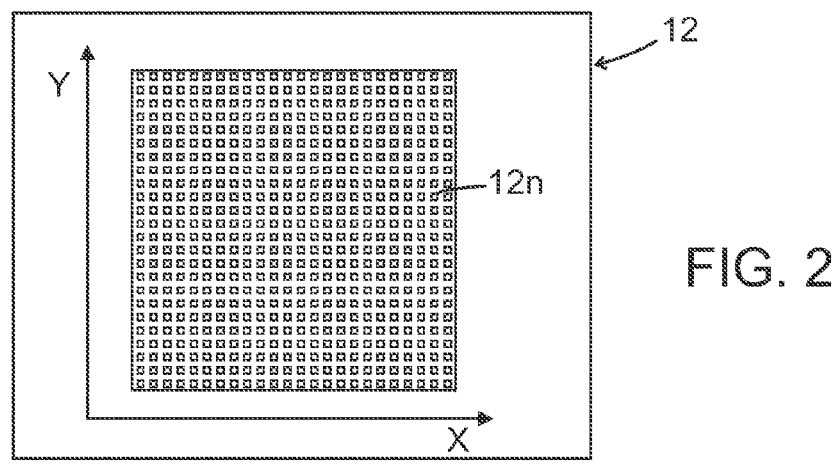
FIG. 2
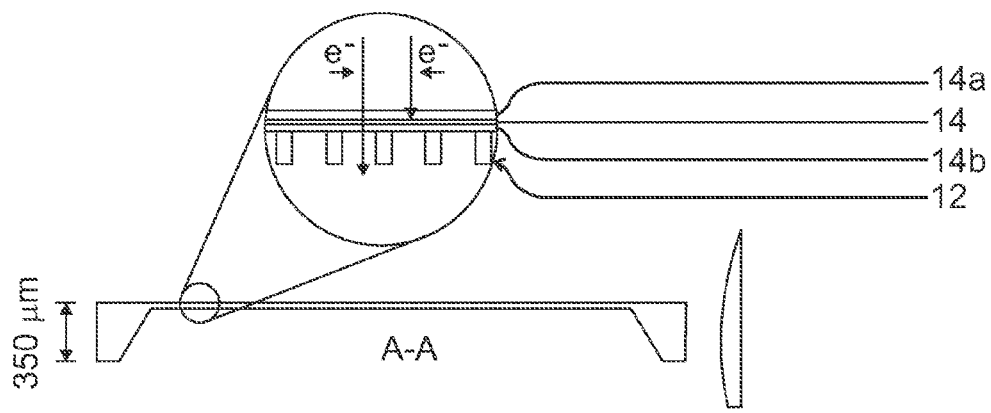
FIG. 3

SPIN-FILTER AND DETECTOR COMPRISING THE SAME

This application is a national phase of International Application No. PCT/SE2012/050318 filed Mar. 22, 2012 and published in the English language.

TECHNICAL FIELD

The present invention relates to a spin-filter and spin-detector comprising the same.

BACKGROUND

Detection of angular momentum of electrons also called "spin" is important within the field of spin electronics and applications such as spintronics.

Current spin-detectors operate with Mott scattering, spin-LEED, or the exchange scattering method. These methods and other existing but rarely used methods have very low transmission. The transmission of devices, including spin-including detectors, based on Mott scattering or spin-LEED are typically in the order of $10^{-3}$ and in addition has a rather low so-called Sherman function, typically around 0.2. In addition, the existing solutions do not enable parallel detection of spin, momentum and energy. This is in stark contrast to modern hemispherical analyzers for spin integrated photo emission that are two-dimensional and measure a range of energies and angles in parallel.

Spin-detectors are usually classified according to a so-called figure of merit defined as $$G = I/I_0 * S_{\mathit{eff}}^2$$

where $I/I_0$ is the proportion of incoming electrons being detected. $S_{\mathit{eff}}$ is how true the detection is with respect to spin. An ideal detector has $G=1$, but typically G is in the range $10^{-3}$-$10^4$ for all existing detectors except the so-called "magnetic film diffraction detector", which has shown a figure of merit exceeding $10^{-2}$. All these existing detectors can however only detect one electron at a time. In case of photoelectron spectroscopy for example, they operate by measuring the spin asymmetry for a single energy and angle at a time. This makes the figure of merit for existing detectors practically being close to $10^{-8}$. It is this low figure of merit that has prevented spin-resolved electronscopy from becoming more widely used in practice.

Thus, there has been a long-felt need to provide spin-detectors having higher transmission, higher Sherman function and thus higher figure of merit.

SUMMARY OF THE INVENTION

According to an aspect, the present invention provides a spin-filter that is based on a membrane layer having thin film supporting structures covered with, or provided with magnetic thin-film(s), hereinafter called "pores". Typically, the thin film supporting structures are small holes, or pores, but also other thin film supporting structures such as a fine mesh or the like can be provided instead.

In this context, the term "pore" means a hole covered with or a hole structure comprising a magnetic thin film. The term "pore" also includes any other type of cavity having any shape, capable of comprising, typically supporting, the thin film such that the film can be thin enough for transfer of electrons, but stop other components from being transmitted.

In this context, by the term "spin-filter-membrane layer" is meant a layer having one or more thin film-support structure(s) comprising small holes, wherein each hole is covered with, or is provided with a magnetic thin-film layer. Each hole covered with or hole structure comprising a magnetic thin film layer, also referred to as a so-called pore can also be regarded as a thin film supporting structure per se being in the shape of a longitudinal hole structure similar to a tube having a thin film layer positioned therein perpendicular to the longitudinal direction. Due to small size of the hole structure, the magnetic thin film layer provided therein can be made thin enough to enable electrons to be transmitted through the thin film layer, but stop other components from being transmitted. Typically, a surface of the magnetic thin film is essentially lower than an overall surface of the spin-filter-membrane layer.

In this context, the term "small" means microscopic dimension.

The inventive spin-filter is based on the principal of the spin-filter effect of magnetic thin-films. It is known that a magnetic thin-film is effective as a spin-filter and that magnetic thin-films have a spin dependent transmission probability for low energy electrons (herein, the term "low energy" means <20 eV).

Typically, in order to have a reasonable transmission, the film thickness has to be less than 10 nm and the technical difficulties in providing this over a two dimensional area being large enough has hampered attempts of using magnetic thin films as spin-filters for spin-detection. This problem is now solved by means of the present invention based on a magnetic thin-film stabilized, or supported, by means of a support structure having small holes or pores comprising magnetic thin film being thin enough for transmission of electrons.

By means of the present invention, a higher transmission and a higher Sherman function can be achieved as well as parallel spin-filtration and two-dimensional detection schemes. Moreover, the design also permits extensions to three dimensional detection schemes.

According to an embodiment of the present invention, there is provided a spin-filter for detection of angular momentum of electrons, wherein the spin-filter comprises a substrate, provided with a membrane layer comprising a plurality of thin-film supporting structures, comprising pores comprising magnetic thin-film for transmission of electrons.

Typically, the membrane layer comprises a large number of thin film supporting structures distributed over a two-dimensional area of the substrate.

Typically, the surfaces of the thin films of the pores are well below an outer surface of the membrane layer.

Typically, the thickness of the magnetic thin-film of the pores is within the range of 1 to 10 nm, which is well below the thickness of the membrane layer.

More than one magnetic layer can be provided in a combination of layers, provided the thickness of the combination of layers is thin enough for transmission of electrons. Also other layers can be provided in any suitable number.

Typically, the magnetic thin film is coated with one or more capping layers.

According to another aspect of the present invention, there is also provided a detector device for detection of angular momentum of electrons, comprising a thin-film electronic spin-filter, wherein the spin-filter comprises a substrate, provided with at least one membrane layer having a plurality of thin film support structures, wherein the thin film support structures are provided with pores having magnetic thin-film(s) for transmission of electrons.

The microscopic dimensions of the pores enable the total magnetic thin-film thickness to be only a few nm. Hereby, the thin-film thickness is sufficiently thin to enable electrons to be transmitted through the thin-film.

The inventive spin-filter finds application for instance in devices such as spin-detectors. The spin filter can also be used for generating spin polarized electrons.

BRIEF DESCRIPTION OF THE DRAWINGS

The features and advantages of the present invention as described and additional ones will become further apparent from the following detailed description and the accompanying drawings, of which:

FIG. 1a is a planar view from above of a spin-filter having a number of magnetic thin film support structures for detection of angular momentum of electrons according to an embodiment of the present invention;

FIG. 1b is a sectional view along line A-A of the same spin-filter as is illustrated in FIG. 1a;

FIG. 1c is an enlarged view in cross-section of a single thin film support structure;

FIG. 2 illustrates an enlarged view from above of the thin film support structure having pores with a metric scale indicated;

FIG. 3 illustrates a spin-filter for detection of angular momentum of electrons according to another embodiment of the present invention, comprising capping layers surrounding the magnetic thin-film layer.

DETAILED DESCRIPTION OF THE INVENTION

Figure 4:
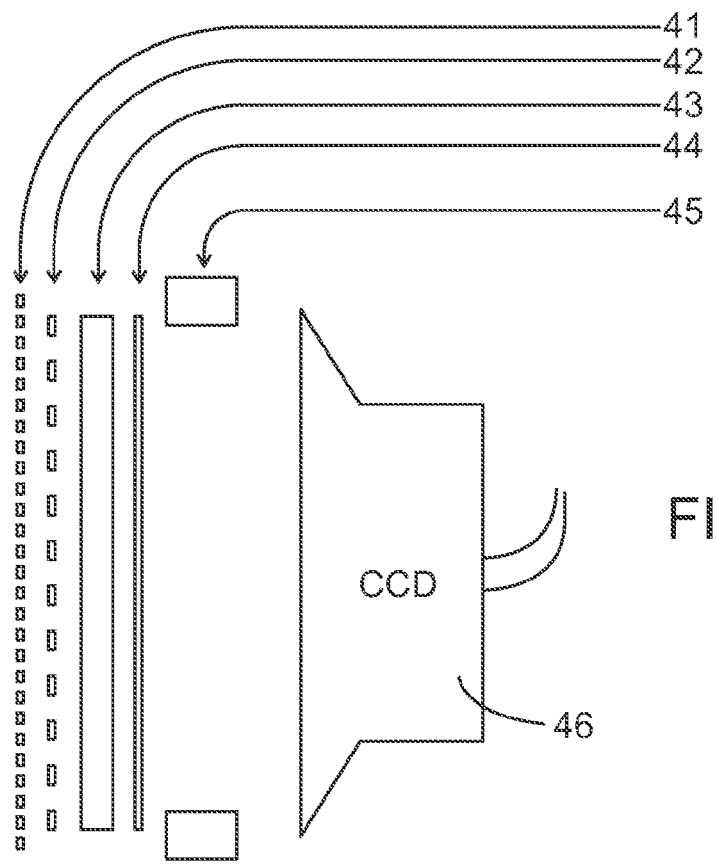
FIG. 4 illustrates a detector device with a spin-filter according to an embodiment of the present invention.

Now is first referred to FIG. 1a-c illustrating a spin-filter according to an embodiment of the present invention. FIG. 1a is a planar view from above of a spin-filter; FIG. 1b is a sectional view of the same spin-filter as is illustrated in FIG. 1a along line A-A; and FIG. 1c is an enlarged view in cross-section of a single membrane. FIG. 1a-c illustrates a spin-filter device 1 for detection of angular momentum of electrons according to an embodiment of the present invention. Now is referred in particular to FIG. 1a and b. The spin-filter 1 comprises a substrate 10 having a first surface 11, provided with at least one membrane layer 12 having a plurality of thin film support structures 12n, having hole structures such as pores or cavities. As illustrated in this particular figure, the thin film support structures 12n are provided with pores 13 comprising a magnetic thin-film 14 for transmission of electrons e- (See enlarged view in FIG. 1c).

Typically, the thickness of the magnetic thin-film 14 is less than 10 nm in order to have reasonable transmission, but typically the thickness of the magnetic thin-film 14 is only a few nm.

The membrane layer 12 can have a large number n of thin film support structures $12_n$, where n=1-1 000 000, distributed over a two-dimensional area X-Y of the substrate 10. Each thin film support structure $12_n$, of which only one is shown in enlargement in FIG. 1c, typically is in the form of a pore comprising a thin-film 14. The thin-film 14 is typically positioned below an outer surface 11 of the substrate/membrane layer 12 in a cavity such that the thin-film 14 is mechanically protected (See FIG. 1c). The thin film support structures 12n can have any suitable shape such as square, circular, triangular, rectangular, of which square shape is illustrated in FIG. 1a-c.

The substrate 10 can be a circular disc having large size such as a diameter of 2" as illustrated in FIG. 1A and B, or even 4" (not shown), which is a great advantage. This permits the use of the inventive spin-filter 1 directly in front of a typical MCP-detector package. The inventive spin-filter 1 can replace the aperture, transfer lens and high voltage electronics required for current spin detectors. This will be illustrated and described more with reference to FIG. 4.

The thin film support structure 12n can have a side of a few hundred μm, as illustrated in FIG. 1a, but also smaller or larger diameters or any number of membranes $12_n$, provided there is space enough on the substrate is possible.

There are a number of alternative ways to produce the membranes $12_n$. They may be provided by depositing the thin films on a supporting layer of silicon oxide that is removed later on, but may alternatively be provided by having a layer with through-going holes onto which a layer of graphen is deposited.

The substrate 10 is typically a conventional 2" silicon (Si) wafer disc, but also any other semi-conducting material such as germanium (Ge), or gallium-arsenide (GaS) or dimensions can be employed instead provided that the step of covering the first surface 11 with one or more membrane(s) can be provided. The substrate 10 can alternatively be any other suitable stabilizing structure (not shown in any drawing figure) made of supporting bars, mesh, or the like supporting the membrane layer 12.

The membrane layer 12 is then patterned on the substrate 10, herein in the form of a large number of squares in a matrix. See FIG. 3. Thereafter, the magnetic thin film 14 is grown/provided/applied on the patterned wafer on the membrane layer 12. Growth can be achieved by means of using existing methods known to the skilled person. After film growth, the wafer is further patterned using methods known to the skilled person such as photolithographic techniques. Then micro pores (or cavities) 12n are opened in the wafer using conventional methods such as reactive ion etching or other etching techniques such that a matrix of microscopic free standing magnetic thin-films 14 is created in each thin film support structure 12n. The small size of the pores 12n enables the free standing thin-films 14 to have a very small thickness, typically well below 10 nm such that the transmission can be comparable to another types of detectors, $>10^{-3}$. The Sherman function of the thin-film can exceed 0.5 and the figure of merit is therefore potentially higher than that of a conventional spin-LEED or Mott-detector and comparable to the magnetic-film-absorption-detector (i.e. $G=10^{-3}$). In contrast to the magnetic-film-absorption-detector, the spin-filter operates in transmission and can incorporate one or more capping layer(s) that prevent(s) degradation of the magnetic film(s). This prolongs life-time of the spin-filter.

The thin-film comprises one or more magnetic layers through which electron transmission probability is dependent on electron spin direction For instance, the thin film 14 can be a multi-layer structure comprising various layers, being magnetic or not as well as comprising layers providing other features even If these are not shown or described explicitly in FIG. 1. The layers providing the electron transmission probability can be ferromagnetic materials, such as, but not limited to, Ni, Fe, Co, including their alloys.

Now is referred to FIG. 3, which is a schematic view in cross-section along line A-A in FIG. 1a, showing the path of the incoming electrons e-.

The microscopic dimensions of the pores 13 enable the total thin-film thickness A to be only a few nm, such as less than 10 nm, and typically less than 3 nm, provided that the thickness A of the film 14 is sufficiently thin to enable electrons to be transmitted through the film 14 with high probability.

Typically, the magnetic layer 14 can be capped to prevent problems with degradation. The magnetic thin film 14 is positioned between two layers 14a and b preventing the thin film 14 from exposure to mechanical stress and degradation. Other capping layers or means are also possible though not shown in FIG. 3 or described in more detail. The magnetic thin film 14 may also contain or can be provided with a support layer, for instance made of graphen.

Growth of films can be achieved by means of using conventional methods known to a person skilled in the art. Following film growth, micro pores/cavities are 12n provided by means of conventional technique.

Now is referred to FIG. 4.

An important advantage of the inventive spin-filter is that it can be made in large sizes, such as 2", or even 4" wafers. This permits the use of a spin-filter membrane in-front of a typically MCP (Micro Channel Plate)-detector package. Thus, the spin-filter is provided in front of the MCP. In this way, a full-size 40 mm diameter multi-channel plate can be used, which permits the whole normal detector surface to be used. Furthermore, only the normal detector package is used with fluorescent screen and CCD camera behind the MCP. High-voltage circuits, separate detectors, external electronics and vacuum-chambers are eliminated by the inventive spin-filter.

An example of a detector with the inventive spin-filter provided according to an embodiment of the invention is illustrated in FIG. 4, to which is now referred.

The detector comprises in consecutive order from the left to the right, a termination mesh 41, the inventive spin-filter 42, micro channel plates (MCP) 43, a fluorescent screen 44, a window 45 and a CCD 46.

Figure 5:
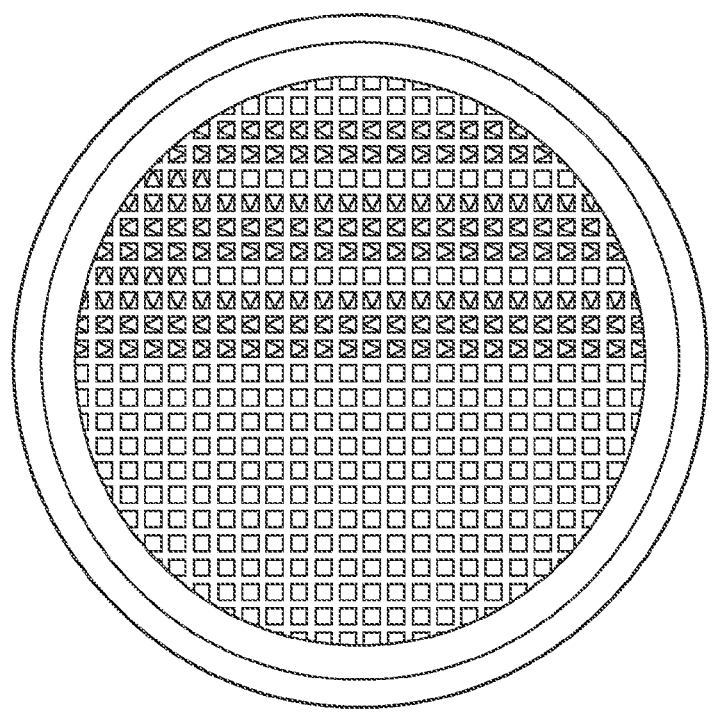
FIG. 5 illustrates a spin-filter for determining the direction of spin of electrons according to an embodiment of the present invention.

By special patterning and selective magnetization, the spin-filter can be made to have alternating regions, thin film support structures, or individual pores with perpendicular in-plane and out-of-plane magnetization that will permit the spin-polarization to be determined in three dimensions. These regions preferably transmit spin up, -down, -left,-right, -forward and backward. The directions of spin are indicated by means of arrows. A typical sweep-mode of a hemispherical analyzer can thus determine magnitude and direction of the in-plane polarization while maintaining the two-dimensional parallel acquisition. This is illustrated in FIG. 5.

The spin-filter can also be employed for generating spin polarized electrons. In this application, unpolarized electrons are transmitted to the filter and polarized electrons are transmitted from the spin filter as a result. This application requires no particular modification of the inventive spin-filter.

Embodiments of the invention have been described above with reference to FIGS. 1-5. However, those skilled in the art will readily appreciate that the detailed description given herein with respect to these figures is for explanatory purposes as the invention extends beyond these limited embodiments.

The foregoing detailed description is intended to illustrate and provide easier understanding of the invention, and should not be construed as limitations. Alternative embodiments will become apparent to those skilled in the art without departing from the spirit and scope of the present invention.

The invention claimed is:

1. A spin-filter for detection of angular momentum of electrons, the spin-filter comprising a substrate, provided with at least one membrane layer having a first surface and having a plurality of thin-film supporting structures, wherein the thin-film supporting structures comprise pores distributed over a two-dimensional area of the substrate, each pore being provided as a hole of microscopic dimension and being in the shape of a longitudinal hole structure having a magnetic thin-film, for transmission of electrons, positioned therein perpendicular to the longitudinal direction, wherein a surface of the magnetic thin-film is essentially lower than the first surface of the membrane layer, and wherein a thickness of the magnetic thin-film of the pores is within a range of 1 to 10 nm.

2. The spin-filter according to claim 1, wherein the membrane layer comprises a number of thin-film support structures distributed over a two-dimensional area of the substrate.

3. The spin-filter according to claim 1, wherein the magnetic thin-film of the thin-film supporting structure is below the first surface.

4. The spin-filter according to claim 1, wherein the magnetic thin-film comprises a ferromagnetic material.

5. The spin-filter according to claim 3, wherein the magnetic thin-film is coated with one or more capping layers.

6. The spin-filter according to claim 1, wherein the magnetic thin-film and/or the membrane layer has selected magnetization of the magnetic film in selected regions/areas permitting selected transmission of selected electron spin directions.

7. A method of using a spin-filter comprising: providing the spin-filter according to claim 1, and generating spin-polarized electrons.

8. The spin-filter according to claim 1, wherein the magnetic thin-films positioned in the pores of the thin-film supporting structures form a matrix of microscopic free-standing magnetic thin-films patterned over the two-dimensional area of the substrate.

9. A detector comprising micro channel plates for detection of angular momentum of electrons, comprising a spin-filter according to claim 1 for detection of angular momentum of electrons, wherein the spin-filter comprises a substrate, provided with at least one membrane layer having a first surface and having a plurality of thin-film supporting structures, wherein the thin-film supporting structures comprise pores distributed over a two-dimensional area of the substrate, each pore be provided as a hole of microscopic dimension and being in the shape of a longitudinal hole structure having a magnetic thin-film, for transmission of electrons, positioned therein perpendicular to the longitudinal direction, wherein a surface of the magnetic thin-film is essentially lower than the first surface of the membrane layer, and wherein a thickness of the magnetic thin-film of the pores is within a range of 1 to 10 nm.

* * * * *